United States Patent
Dai et al.

(10) Patent No.: US 11,916,062 B2
(45) Date of Patent: Feb. 27, 2024

(54) TRANSIENT TRIGGERED ACTIVE FET WITH SURGE IMMUNITY

(71) Applicant: Texas Instruments Incorporated, Dallas, TX (US)

(72) Inventors: Xianzhi Dai, Shanghai (CN); Rajkumar Sankaralingam, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 379 days.

(21) Appl. No.: 16/724,129

(22) Filed: Dec. 20, 2019

(65) Prior Publication Data

US 2020/0321331 A1 Oct. 8, 2020

Related U.S. Application Data

(60) Provisional application No. 62/830,126, filed on Apr. 5, 2019.

(51) Int. Cl.
*H02H 9/04* (2006.01)
*H01L 27/02* (2006.01)
*H02H 3/20* (2006.01)

(52) U.S. Cl.
CPC ........... *H01L 27/0266* (2013.01); *H02H 3/20* (2013.01); *H02H 9/04* (2013.01); *H02H 9/041* (2013.01); *H01L 27/0285* (2013.01)

(58) Field of Classification Search
CPC . H01L 27/02; H01L 27/0266; H01L 27/0921; H01L 27/0248; H02H 9/04; H02H 9/041; H02H 9/046; H02H 9/005; H02H 9/00; H02H 3/20; H02H 3/22

USPC .......................................... 361/56, 91.1, 111
See application file for complete search history.

(56) References Cited

U.S. PATENT DOCUMENTS

| | | | |
|---|---|---|---|
| 6,249,410 B1 | 6/2001 | Ker et al. | |
| 9,172,241 B2 | 10/2015 | Chen | |
| 9,692,229 B2 | 6/2017 | Kunz, Jr. et al. | |
| 9,972,999 B2 | 5/2018 | Peachey | |
| 9,997,509 B2 | 6/2018 | Chaudhry et al. | |
| 2006/0039093 A1 | 2/2006 | Gauthier, Jr. et al. | |
| 2007/0188953 A1* | 8/2007 | Lee ..................... | H01L 27/0285 361/56 |
| 2010/0149701 A1* | 6/2010 | Drapkin ................ | H02H 9/046 361/56 |

(Continued)

*Primary Examiner* — Danny Nguyen
(74) *Attorney, Agent, or Firm* — Andrew R. Ralston; Frank D. Cimino

(57) ABSTRACT

A microelectronic device has a protected line and a reference line, and an active field effect transistor (FET) coupled between the protected line and the reference line. The microelectronic device includes an electrostatic discharge (ESD) trigger circuit coupled to the gate of the active FET, to turn on the active FET when an ESD event occurs on the protected line. The microelectronic device further includes a transient detection circuit having a high bandwidth detector, an ESD detector, and an output driver. The ESD detector is configured to provide a CLEAR signal to the output driver when an ESD event occurs on the protected line. The output driver is configured to turn off the active FET when a voltage surge, which can damage the active FET, occurs on the protected line, but enable operation of the active FET by the ESD trigger circuit during an ESD event.

28 Claims, 3 Drawing Sheets

(56) References Cited

U.S. PATENT DOCUMENTS

| | | | |
|---|---|---|---|
| 2010/0321841 A1* | 12/2010 | Worley | H02H 9/046 |
| | | | 361/56 |
| 2014/0355157 A1* | 12/2014 | Huang | H02H 9/046 |
| | | | 361/56 |
| 2015/0214732 A1* | 7/2015 | Haruki | H02H 9/042 |
| | | | 361/56 |
| 2017/0373490 A1* | 12/2017 | Zhu | H01L 27/0255 |
| 2018/0026440 A1* | 1/2018 | Zhao | H02H 9/042 |
| | | | 361/56 |
| 2020/0083705 A1* | 3/2020 | Xavier | H01L 27/0285 |

* cited by examiner

US 11,916,062 B2

TRANSIENT TRIGGERED ACTIVE FET WITH SURGE IMMUNITY

CROSS-REFERENCE TO RELATED APPLICATIONS

This application claims the benefit of priority under 35 U.S.C. § 119(e) of U.S. Provisional Application No. 62/830,126, filed 5 Apr. 2019, which is hereby incorporated by reference in its entirety.

FIELD

This disclosure relates to the field of microelectronic devices. More particularly, this disclosure relates to overvoltage protection circuits in microelectronic devices.

BACKGROUND

Many microelectronic devices have voltage-sensitive circuits which can be damaged by overvoltage transients, such as electrostatic discharge (ESD) events or voltage surge events. ESD events may be characterized by high voltages, over 100 volts, with short durations, typically less than 100 nanoseconds, and energies less than 1 millijoule. Voltage surge events may be characterized by voltages that are several volts above the maximum safe operating range of the voltage-sensitive circuits, with high current capacity of tens of amps, rise times longer than 500 nanoseconds, durations of greater than 1 millisecond, and energies greater than 100 millijoules. Some protective circuits in the microelectronic devices are designed to provide protection against both ESD events and voltage surge events; these protective circuits commonly have high clamping voltages and thus may not provide adequate protection for the voltage-sensitive circuits. Other protective circuits in the microelectronic devices are designed to provide fast protection specifically against ESD events are susceptible to damage during sustained voltage surge events.

SUMMARY

The present disclosure introduces a microelectronic device having a protected line and a reference line, and a field effect transistor (FET) having a drain coupled to the protected line, a source coupled to the reference line, and a gate. The FET is referred to herein as the active FET. The microelectronic device includes an electrostatic discharge (ESD) trigger circuit coupled to the protected line, and to the gate of the active FET. The ESD trigger circuit is configured to provide an on-state signal to the gate of the active FET when an overvoltage transient characteristic of an ESD event, occurs on the protected line. The microelectronic device also includes a gate control circuit coupled to the gate of the active FET. The gate control circuit is configured to provide an off-state signal to the gate of the active FET, turning the active FET off, when a DEACTIVATE signal is provided the gate control circuit. the gate control circuit is configured to provide a high impedance state to a gate of the active FET when a low state is provided to the gate control circuit, enabling operation of the active FET by the ESD trigger circuit.

The microelectronic device further includes a transient detection circuit having a high bandwidth detector, an ESD detector, and an output driver. The high bandwidth detector is coupled to the protected line and to the output driver. The high bandwidth detector is configured to provide an ENABLE signal to the output driver when an overvoltage transient, including both an ESD event and a voltage surge event, occurs on the protected line.

The ESD detector is coupled to the protected line and to the output driver. The ESD detector is configured to provide a CLEAR signal to the output driver when an overvoltage transient characteristic of an ESD event occurs on the protected line, and otherwise provide a high impedance state.

The output driver is configured to provide the DEACTIVATE signal to the gate control circuit when the ENABLE signal is provided from the high bandwidth detector and the ESD detector provides the high impedance state. The output driver is further configured to provide the low state to the gate control circuit when the CLEAR signal is provided from the ESD detector.

The transient detection circuit and control circuit are thus configured to enable the ESD trigger circuit turn on the active FET when a fast overvoltage transient, characteristic of an ESD event, occurs on the protected line. The transient detection circuit and control circuit are thus further configured to turn off the active FET when a slow overvoltage transient, characteristic of a voltage surge event, occurs on the protected line.

DETAILED DESCRIPTION

For the purposes of this disclosure, the term "characteristic of an ESD event" refers to overvoltage transients encompassing any overvoltage transients prescribed by the Human Body Model, the Charged Device Model, the Machine Model, or the IEC 61000-4-2 Immunity Standard. The Human Body Model may be implemented by discharging a charged 100 picofarad (pF) capacitor through a 1.5 kilo-ohm (kohm) resistor in series with a device under test (DUT), exhibiting a rise time less than 10 nanoseconds. The Charged Device Model may be implemented by discharging a charged DUT through a parasitic inductance in series with a 1 ohm resistor, exhibiting a rise time less than 1 nsec. The Machine Model may be implemented by discharging a charged 200 pF capacitor through a 0.5 microhenry ($\mu$H) inductor in series with a DUT, exhibiting a rise time less than 10 nsec. The IEC 61000-4-2 Immunity Standard specifies a rise time of 0.6 nsec to 1.0 nsec. The term "characteristic of an ESD event" excludes, that is, does not encompass, voltage surge events, with rise times longer than 500 nanoseconds. Thus, in some cases, overvoltage transients may exhibit characteristics of an ESD event, that is, high voltages, over 100 volts, with short durations, typically less than 100 nanoseconds, and energies less than 1 millijoule. In other cases, overvoltage transients may exhibit characteristics of a voltage surge event, that is, voltages that are several volts above the maximum safe operating range of voltage-sensitive circuits, with high current capacities greater than an ampere, rise times longer than 500 nanoseconds, durations of greater than 1 millisecond, and energies greater than 100 millijoules.

For the purposes of this disclosure, rise time is defined as a time duration for a transient to increase in potential from 20 percent of a peak potential of the transient to 80 percent of the peak potential. For the purposes of this disclosure, the term "high impedance state" refers to a circuit node having an impedance of at least 100 kohms to any DC line such as a power line or a ground line.

Figure 1:
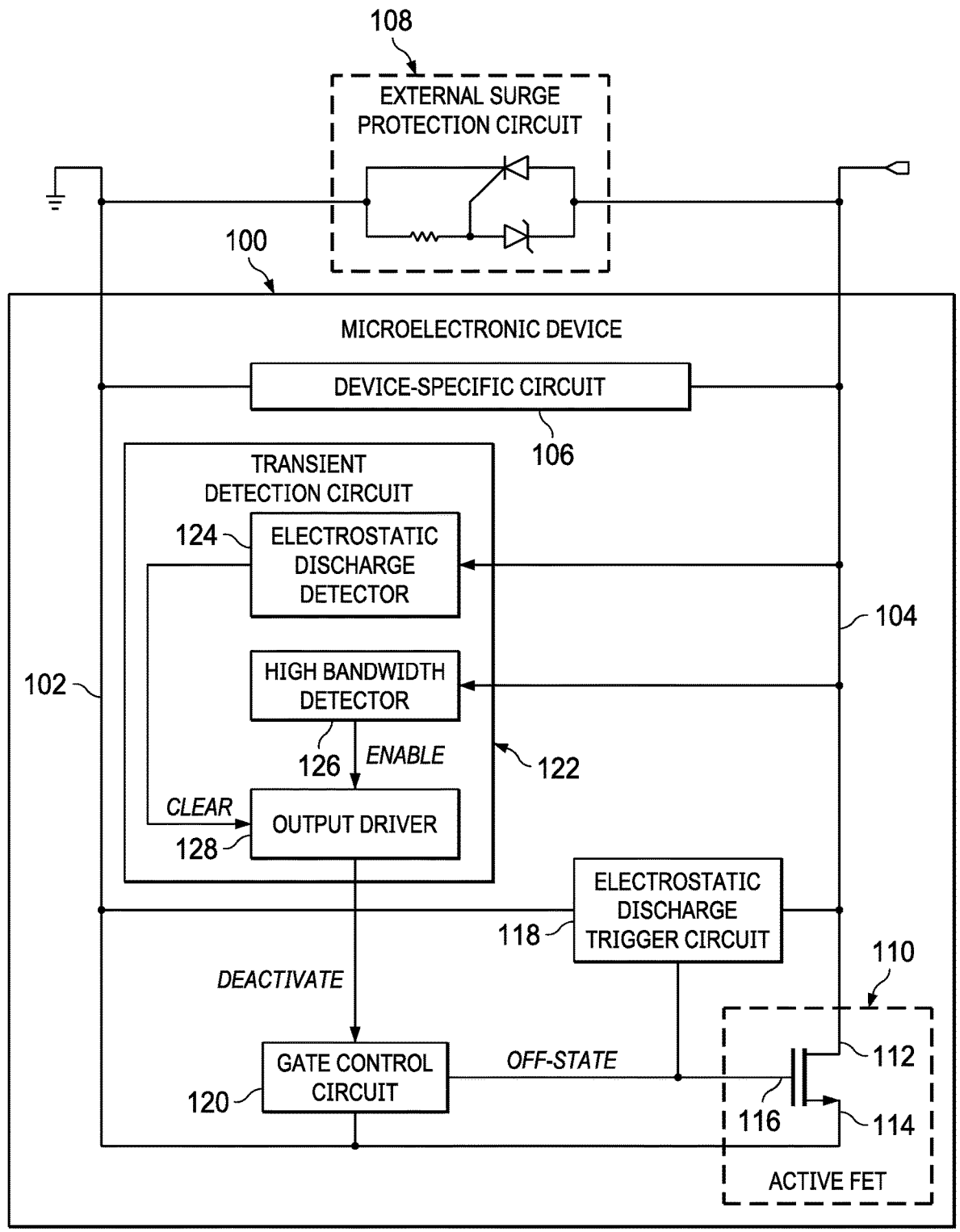
FIG. 1 is a diagram of an example microelectronic device with an active FET.

FIG. 1 is a diagram of an example microelectronic device 100 with an active FET 110. The microelectronic device 100 may be implemented as an integrated circuit, for example, a microcontroller, a memory device, such as a dynamic random access memory (DRAM) device, a communication device, a signal processing device, an amplifier, or a power management device. The microelectronic device 100 may be implemented as a microelectrical mechanical system (MEMS) device, an electro-optical device, or a micro-optical mechanical system (MOMS) device. Other implementations of the microelectronic device 100 are within the scope of this example. The microelectronic device 100 includes a reference line 102, which may be manifested as an interconnect line coupled to a substrate of the microelectronic device, for example, sometimes referred to as "ground" or "$V_{SS}$". Alternatively, the reference line 102 may be manifested as an interconnect line that provides a local ground for circuits, such as analog circuits or digital circuits, of the microelectronic device 100, sometimes referred to as "$V_{SSA}$" or "$V_{SSD}$", respectively. The microelectronic device 100 also includes a protected line 104, separate from the reference line 102. The protected line 104, in some cases, may be manifested as a power supply interconnect line for the microelectronic device 100, sometimes referred to as "$V_{DD}$". In other cases, the protected line 104 may be manifested as a local bias supply interconnect line for the analog circuits or digital circuits, sometimes referred to as "$V_{DDA}$" or "$V_{DDD}$", respectively. In further cases, the protected line 104 may be manifested as a signal interconnect line, sometimes referred to as an input/output (I/O) line, of the microelectronic device 100. Other manifestations of the reference line 102 and the protected line 104 are within the scope of this example. The microelectronic device 100 includes a device-specific circuit 106 coupled to the protected line 104 and the reference line 102. The device-specific circuit 106 may be sensitive to voltages above a safe operating limit. The microelectronic device may be exposed to overvoltage transients on the protected line 104, relative to the reference line 102. In some cases, the overvoltage transients may exhibit characteristics of an ESD event. In other cases, the overvoltage transients may exhibit characteristics of a voltage surge event. Maintaining reliable operation of the microelectronic device 100 requires protection from ESD events and immunity to voltage surge events. Immunity to voltage surge events may be provided by an external surge protection circuit 108 that is not part of the microelectronic device 100, but is connected to the protected line 104 and the reference line 102. The active FET 110 should be kept off during the voltage surge event to avoid being triggered before the external surge protection circuit 108 starts to conduct current and clamps a voltage on the protected line 104 to a safe level. FIG. 1 depicts the external surge protection circuit 108 implemented as a Zener-trigger silicon controlled rectifier (SCR); other implementations of the external surge protection circuit 108 are within the scope of this example.

The microelectronic device 100 includes the active FET 110. As used herein, the term "active FET" refers to a FET connected between the protected line 104 and the reference line 102, and configured to provide a low-resistance connection between the protected line 104 and the reference line 102 under predefined conditions. The active FET 110 acts as a switch between the protected line 104 and the reference line 102. The active FET 110 has a drain 112 directly coupled to the protected line 104, and has a source 114 directly coupled to the reference line 102. For the purposes of this disclosure, the term "directly coupled" refers to being electrically coupled so as to enable a direct current (DC) to pass with an impedance less than 100 ohms. The drain 112 may be directly coupled to the protected line 104 through interconnect lines, contacts, and vias of the microelectronic device 100, for example. Similarly, the source 114 may be directly coupled to the reference line 102 through other interconnect lines, contacts, and vias of the microelectronic device 100. The active FET 110 has a gate 116. The active FET 110 may provide protection for the device-specific circuit 106 during ESD events by being turned on, and thus shunting the excess current from the protected line 104 to the reference line 102. During voltage surge events, the active FET 110 may be turned off to avoid damage to the active FET 110 due to high potentials on the protected line 104.

The microelectronic device 100 includes an ESD trigger circuit 118 coupled to the protected line 104, the reference line 102, and to the gate 116 of the active FET 110. The ESD trigger circuit 118 is configured to provide an on-state signal to the gate 116 of the active FET 110 when a transient occurs on the protected line 104 that is characteristic of an ESD event. The on-state signal provided by the ESD trigger circuit 118 turns on the active FET 110, effectively connecting the protected line 104 to the reference line 102 with a resistance less than 100 ohms through the active FET 110. The ESD trigger circuit 118 provides the on-state signal to the gate 116 whether or not the microelectronic device 100 is powered. The ESD trigger circuit 118 does not provide the on-state signal during a voltage surge event. However, a potential on the protected line 104 during a voltage surge event will tend to raise the potential of the gate 116 of the active FET 110 through capacitive coupling. Thus, keeping the active FET 110 in an off state during the voltage surge event requires an off-state signal to be applied to the gate 116 of the active FET 110.

The microelectronic device 100 includes a gate control circuit 120 coupled to the gate 116 of the active FET 110. The gate control circuit 120 may be coupled to the reference line 102, as depicted in FIG. 1. The gate control circuit 120 is configured to provide a high impedance state to the gate 116 when a low state is provided to the gate control circuit 120. The low state may be implemented as a low potential, close to a potential on the reference line 102. The high impedance state may allow other signals, such as a signal from the ESD trigger circuit 118, to control operation of the active FET 110. The gate control circuit 120 is further configured to provide an off-state signal to the gate 116 when a DEACTIVATE signal is provided to the gate control circuit 120. The DEACTIVATE signal may be implemented as an on-state potential, above a threshold of transistors in the gate control circuit 120. The off-state signal from the gate control circuit 120 holds the gate 116 below a threshold potential of the active FET 110, thus turning off the active FET 110. The off-state signal provided by the gate control circuit 120 may be used to keep the active FET 110 in the off state during a voltage surge event.

The microelectronic device further includes a transient detection circuit 122 having an ESD detector 124, a high bandwidth detector 126, and an output driver 128. The ESD detector 124 is coupled to the protected line 104 and to the output driver 128. The ESD detector 124 is configured to provide a CLEAR signal to the output driver 128 when an overvoltage transient having a fast rise time, characteristic of an ESD event, occurs on the protected line 104. In cases of overvoltage transients with slow rise times, the CLEAR signal is not provided by the ESD detector 124; in such cases, the ESD detector 124 may provide a high impedance state.

The high bandwidth detector 126 is coupled to the protected line 104 and to the output driver 128. The high bandwidth detector 126 is configured to provide an ENABLE signal to the output driver 128 when an overvoltage transient, encompassing both an ESD event and a voltage surge event, occurs on the protected line 104.

The output driver 128 is configured to provide the low state to the gate control circuit 120 when the CLEAR signal is provided from the ESD detector 124. The output driver 128 is further configured to provide the DEACTIVATE signal to the gate control circuit 120 when the ENABLE signal is provided from the high bandwidth detector 126 and the CLEAR signal is not provided by the ESD detector 124.

Thus, the microelectronic device 100 is configured to operate as follows, during an ESD event. The ESD event causes the ESD trigger circuit 118 to provide the on-state signal to the gate 116 of the active FET 110, turning on the active FET 110. The ESD event also causes the ESD detector 124 to provide the CLEAR signal to the output driver 128, and causes the high bandwidth detector 126 to provide the ENABLE signal to the output driver 128. The output driver 128, receiving both the ENABLE signal from the high bandwidth detector 126 and the CLEAR signal from the ESD detector 124, provides the low state to the gate control circuit 120. The gate control circuit 120, receiving the low state, provides the high impedance state to the gate 116 of the active FET 110, allowing the active FET 110 to remain in the on-state caused by the on-state signal from the ESD trigger circuit 118.

Further, the microelectronic device 100 is configured to operate as follows, during a voltage surge event. The voltage surge event causes a potential on the gate 116 of the active FET 110 to rise. The voltage surge event does not activate the ESD detector 124, so that the ESD detector 124 does not provide the CLEAR signal to the output driver 128. The voltage surge event causes the high bandwidth detector 126 to provide the ENABLE signal to the output driver 128. The output driver 128, receiving the ENABLE signal from the high bandwidth detector 126 but not receiving the CLEAR signal from the ESD detector 124, provides the DEACTIVATE signal to the gate control circuit 120. The gate control circuit 120, receiving the DEACTIVATE signal, provides the off-state signal to the gate 116 of the active FET 110, causing the active FET 110 to turn off, limiting current through the active FET 110 to leakage currents, which may advantageously protect the active FET 110 from damage, thus providing immunity to the voltage surge event for the active FET 110.

Table 1 summarizes the operation of the ESD trigger circuit 118, the transient detection circuit 122, the gate control circuit 120, and the active FET 110 during an ESD event and during a voltage surge event.

TABLE 1

| Overvoltage transient | ESD event | Voltage surge event |
| --- | --- | --- |
| ESD trigger circuit | Provides on-state signal to gate of active FET | Does not provide on-state signal to gate of active FET |
| ESD detector | Provides CLEAR signal to output driver | Provides high impedance state to output driver |
| High bandwidth detector | Provides ENABLE signal to output driver | Provides ENABLE signal to output driver |
| Output driver | Provides low state to gate control circuit | Provides DEACTIVATE signal to gate control circuit |
| Gate control circuit | Provides high impedance state to gate of active FET | Provides off-state signal to gate of active FET |
| Active FET | Stays on while ESD detector provides CLEAR signal | Turns off |

Figure 2:
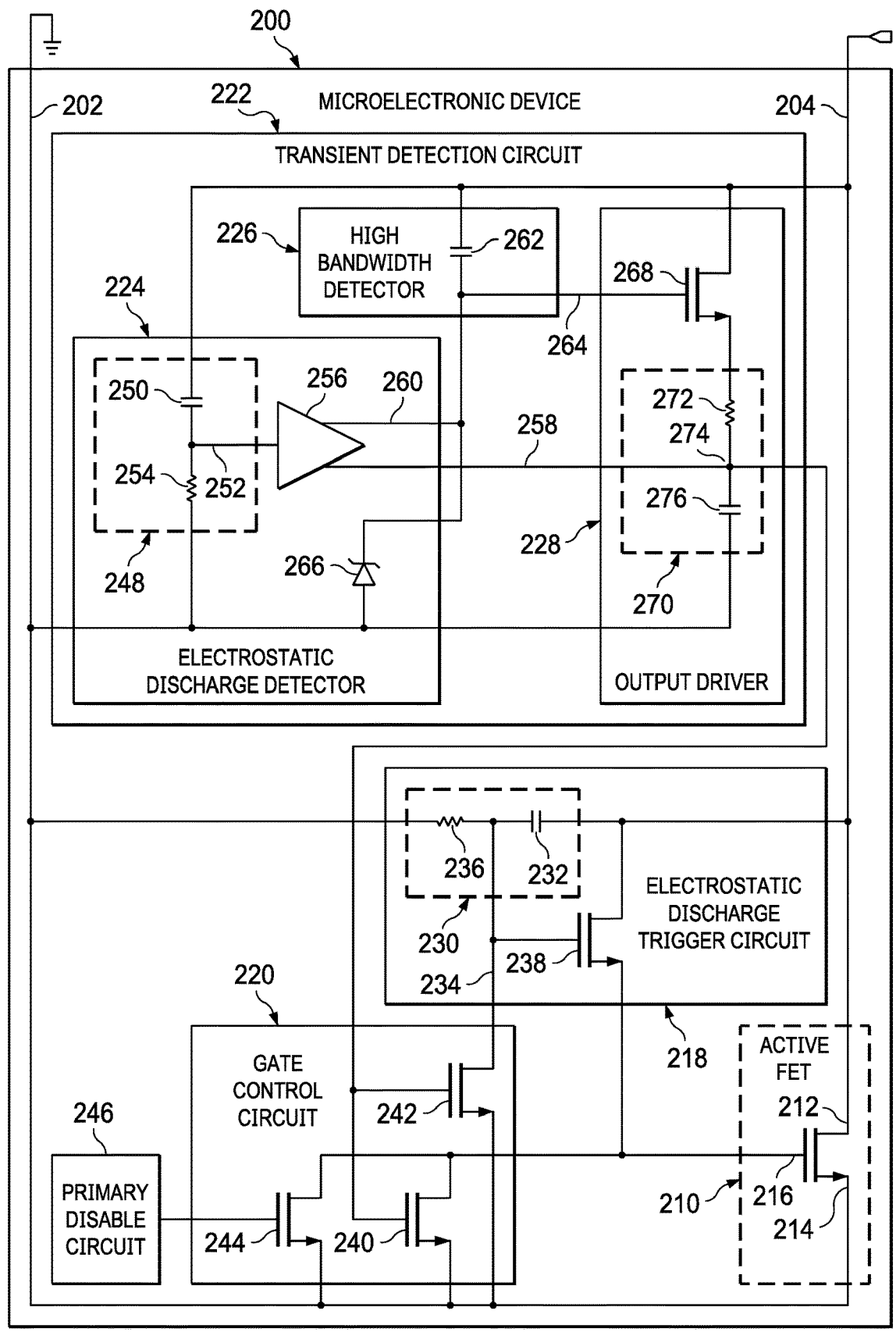
FIG. 2 is a diagram of an example microelectronic device with an active FET.

FIG. 2 is a diagram of an example microelectronic device 200 with an active FET 210. FIG. 2 discloses a more specific implementation of circuits to protect the active FET 210, which may advantageously provide an efficient circuit layout in the microelectronic device 200. The microelectronic device 200 includes a reference line 202 and a protected line 204. The reference line 202 and the protected line 204 may be manifested as disclosed in reference to FIG. 1. Other manifestations of the reference line 202 and the protected line 204 are within the scope of this example. The microelectronic device 200 may include a device-specific circuit, not shown in FIG. 2, coupled to the protected line 204 and the reference line 202, which may be sensitive to voltages above a safe operating limit.

The microelectronic device 200 includes the active FET 210, with a drain 212 directly coupled to the protected line 204, a source 214 directly coupled to the reference line 202, and a gate 216. The active FET 210 may provide protection for the device-specific circuit during ESD events by being turned on, as disclosed in reference to FIG. 1. During voltage surge events, the active FET 210 may be turned off to avoid damage to the active FET 210.

The microelectronic device 200 includes an ESD trigger circuit 218 configured to provide an on-state signal to the gate 216 of the active FET 210 when a transient occurs on the protected line 204 with a rise time characteristic of an ESD event. In this example, the ESD trigger circuit 218 may include an ESD trigger high-pass filter 230 between the protected line 204 and the reference line 202. The ESD trigger high-pass filter 230 may include an ESD trigger capacitor 232 coupled between the protected line 204 and an ESD trigger output line 234 of the ESD trigger high-pass filter 230, and an ESD trigger resistor 236 coupled between the ESD trigger output line 234 and the reference line 202. The ESD trigger circuit 218 of this example may further include a gate driver FET 238 with a drain coupled to the protected line 204, a source coupled to the gate 216 of the active FET 210, and a gate coupled to the ESD trigger output line 234 of the ESD trigger high-pass filter 230. The ESD trigger high-pass filter 230 is configured to apply a potential above the threshold of the gate driver FET 238 to the gate of the gate driver FET 238 when a transient occurs on the protected line 204 that is characteristic of an ESD event. The gate driver FET 238 turns on, coupling the protected line 204 having the overvoltage condition to the gate 216 of the active FET 210, raising the potential of the gate 216 above a threshold of the active FET 210. The ESD trigger circuit 218 thus turns on the active FET 210 during an ESD event. The ESD trigger circuit 218 does not provide the on-state signal during a voltage surge event, characterized by rise times more than an order of magnitude slower than ESD events. The ESD trigger high-pass filter 230 may have a time constant of 5 nanoseconds to 20 nanoseconds, by way of example.

The microelectronic device 200 includes a gate control circuit 220 configured to provide a high impedance state to the gate 216 of the active FET 210 when a low state is provided to the gate control circuit 220, and to provide an off-state signal to the gate 216 when a DEACTIVATE signal is provided the gate control circuit 220. The high impedance state provided by the gate control circuit 220 may allow other signals, such as a signal from the ESD trigger circuit 218, to control operation of the active FET 210. The off-state signal may be implemented as a potential below a threshold potential of the active FET 210, for example, the potential of the reference line 202. In this example, the gate control circuit 220 may include an active FET shunt transistor 240 coupled between the gate 216 of the active FET 210 and the reference line 202. The gate control circuit 220 may also include a gate driver FET shunt transistor 242 coupled between the gate of the gate driver FET 238 and the reference line 202. The gate control circuit 220 may optionally include an operational shunt transistor 244 coupled between the gate 216 of the active FET 210 and the reference line 202. The operational shunt transistor 244 may be controlled by a primary disable circuit 246, configured to turn off the active FET 210 during operation of the microelectronic device 200. The active FET shunt transistor 240, the gate driver FET shunt transistor 242, and the operational shunt transistor 244 may be implemented as FET transistors, as depicted in FIG. 2, which may advantageously simplify fabrication of the microelectronic device 200 when fabricated using a MOS technology.

In this example, the DEACTIVATE signal may implemented as a potential applied to gates of the active FET shunt transistor 240 and the gate driver FET shunt transistor 242 that is sufficiently high to bias the active FET shunt transistor 240 and the gate driver FET shunt transistor 242 into saturation, so that the active FET shunt transistor 240 and the gate driver FET shunt transistor 242 are maintained in on states, which shunts the gate 216 of the active FET 210 to the reference line 202, turning off the active FET 210. The low state may be implemented as a potential below the threshold potentials of the active FET shunt transistor 240 and the gate driver FET shunt transistor 242, applied to the gates of the active FET shunt transistor 240 and the gate driver FET shunt transistor 242. For example, in some cases, the low state may be implemented as a potential close to, or equal to, a potential on the reference line 202. The active FET shunt transistor 240 and the gate driver FET shunt transistor 242 are turned off by the low state, thus providing a high impedance state to the gate 216 of the active FET 210. The active FET 210 is thus enabled to be operated by the ESD trigger circuit 218.

The microelectronic device further includes a transient detection circuit 222 having an ESD detector 224, a high bandwidth detector 226, and an output driver 228. The ESD detector 224 is coupled between the protected line 204 and the reference line 202, and is coupled to the output driver 228. The high bandwidth detector 226 is coupled to the protected line 204 and is coupled to the output driver 228. The output driver 228 is coupled between the protected line 204 and the reference line 202, and is coupled to the gate control circuit 220

In this example, the output driver 228 may include an output transistor 268, which may be implemented as an output FET 268. A drain of the output FET 268 is coupled to the protected line 204, and a source of the output FET 268 is coupled to the reference line 202 through a low-pass filter 270. The output FET 268 has a gate which provides an input of the output driver 228. The low-pass filter 270 may include an output buffer resistor 272 coupled between the source of the output FET 268 and an output node 274 of the output driver 228, and may further include an output buffer capacitor 276 coupled between the output node 274 and the reference line 202. The low-pass filter 270 may have a time constant of 2 nanoseconds to 20 nanoseconds, to reduce high frequency jitter at the output node 274. The output driver 228 is configured to provide the low state to the gate control circuit 220 when a CLEAR signal is provided to the gate of the output FET 268 and to the output node 274 of the output driver 228, from the ESD detector 224. The output driver 228 is further configured to provide the DEACTIVATE signal to the gate control circuit 220 when an ENABLE signal is provided to the gate of the output FET 268 from the high bandwidth detector 226, and a high impedance state is provided to the gate of the output FET 268 and to the output node 274, by the ESD detector 224.

In this example, the ESD detector 224 may include an input high-pass filter 248 between the protected line 204 and the reference line 202. The input high-pass filter 248 may include an input capacitor 250 coupled between the protected line 204 and an output line 252 of the input high-pass filter 248, and an input resistor 254 coupled between the output line 252 and the reference line 202. The input high-pass filter 248 may have a time constant of 5 nanoseconds to 20 nanoseconds, by way of example. The ESD detector 224 may further include a voltage discriminator 256. The output line 252 of the input high-pass filter 248 is coupled to an input of the voltage discriminator 256. The input high-pass filter 248 is configured to apply a sufficient potential to the output line 252 of the input high-pass filter 248 to activate the voltage discriminator 256 when a transient occurs on the protected line 204 that is characteristic of an ESD event. The voltage discriminator 256 is a comparator with hysteresis, with a first output line 258 coupled to the output node 274 of the output driver 228, and a second output line 260 coupled to the gate of the output FET 268. The voltage discriminator 256 is configured to provide the CLEAR signal on the first output line 258 and the second output line 260, when the ESD event occurs on the protected line 204. The voltage discriminator 256 is further configured to provide the high impedance state on the first output line 258 and the second output line 260, in the absence of an ESD event, that is, in the absence of the sufficient potential to the output line 252 of the input high-pass filter 248 to activate the voltage discriminator 256. The ESD detector 224 of this example includes a Zener diode 266, coupled between the second output line 260 and the reference line 202. A threshold of the voltage discriminator 256 and a maximum potential for the gate of the output FET 268 are dependent on a breakdown voltage of the Zener diode 266. The Zener diode 266 may have a breakdown voltage of 5 volts to 6 volts, by way of example.

The ESD detector 224 is configured to provide the CLEAR signal to the first output line 258 and the second output line 260 when an overvoltage transient having a fast rise time, characteristic of ESD events, occurs on the protected line 204. In cases of overvoltage transients with slow rise times, characteristic of voltage surge events, the ESD detector 224 provides the high impedance state to the first output line 258 and the second output line 260. The CLEAR signal may be implemented in this example as a low potential, below the threshold potentials of the active FET shunt transistor 240 and the gate driver FET shunt transistor 242. For example, the CLEAR signal may be implemented as a potential equal to the potential on the reference line 202.

The high bandwidth detector 226 is configured to provide the ENABLE signal to the output driver 228 when an overvoltage transient, encompassing both an ESD event and a voltage surge event, occurs on the protected line 204. In this example, the high bandwidth detector 226 may include a blocking capacitor 262 coupled between the protected line 204 and the gate of the output FET 268. The ENABLE signal may be implemented as a potential sufficient to bias the output FET 268 into saturation.

Thus, the microelectronic device 200 is configured to operate as follows, during an ESD event. The overvoltage transient of the ESD event causes the ESD trigger circuit 218 to raise the potential on the gate 216 of the active FET 210, turning on the active FET 210. The overvoltage transient also is transmitted through the input high-pass filter 248 of the ESD detector 224 and activates the voltage discriminator 256 of the ESD detector 224, causing the voltage discriminator 256 to provide the CLEAR signal, that is, the low potential, close to the potential of the reference line 202, through the first output line 258 to the output node 274 of the output driver 228, and through the second output line 260 to the gate of the output FET 268. The overvoltage transient is transmitted through the blocking capacitor 262 of the high bandwidth detector 226 to provide the ENABLE signal to the gate of the output FET 268, but gate of the output FET 268 remains low due to the CLEAR signal from the voltage discriminator 256 on the second output line 260, turning off the output FET 268. Thus, the output driver 228 provides the DEACTIVATE signal, that is the low potential, to the gate control circuit 220. The low potential of the DEACTIVATE signal turns off the active FET shunt transistor 240 and the gate driver FET shunt transistor 242, providing the high impedance state to the gate 216 of the active FET 210, enabling the ESD trigger circuit 218 to keep the active FET 210 in an on state.

Further, the microelectronic device 200 is configured to operate as follows, during a voltage surge event. The overvoltage transient of the voltage surge event causes a potential on the gate 216 of the active FET 210 to rise. The overvoltage transient does not transmit a voltage amplitude through the input high-pass filter 248 of the ESD detector 224 that is higher than a threshold voltage of the voltage discriminator 256, so that the voltage discriminator 256 does not provide the CLEAR signal, but rather provides the high impedance condition through the first output line 258 to the output node 274 of the output driver 228, and through the second output line 260 to the gate of the output FET 268. The overvoltage transient causes the high bandwidth detector 226 to provide the ENABLE signal to the output driver 228, turning on the output FET 268 of the output driver 228. The output FET 268 being on couples the overvoltage transient to the output node 274, providing the DEACTIVATE signal, that is, the high potential, to the gate control circuit 220. The gate control circuit 220, receiving the DEACTIVATE signal, turns on the active FET shunt transistor 240 and the gate driver FET shunt transistor 242, shorting the gate of the gate driver FET 238 of the ESD trigger circuit 218 and the gate 216 of the active FET 210 to the reference line 202, turning off the active FET 210.

Figure 3:
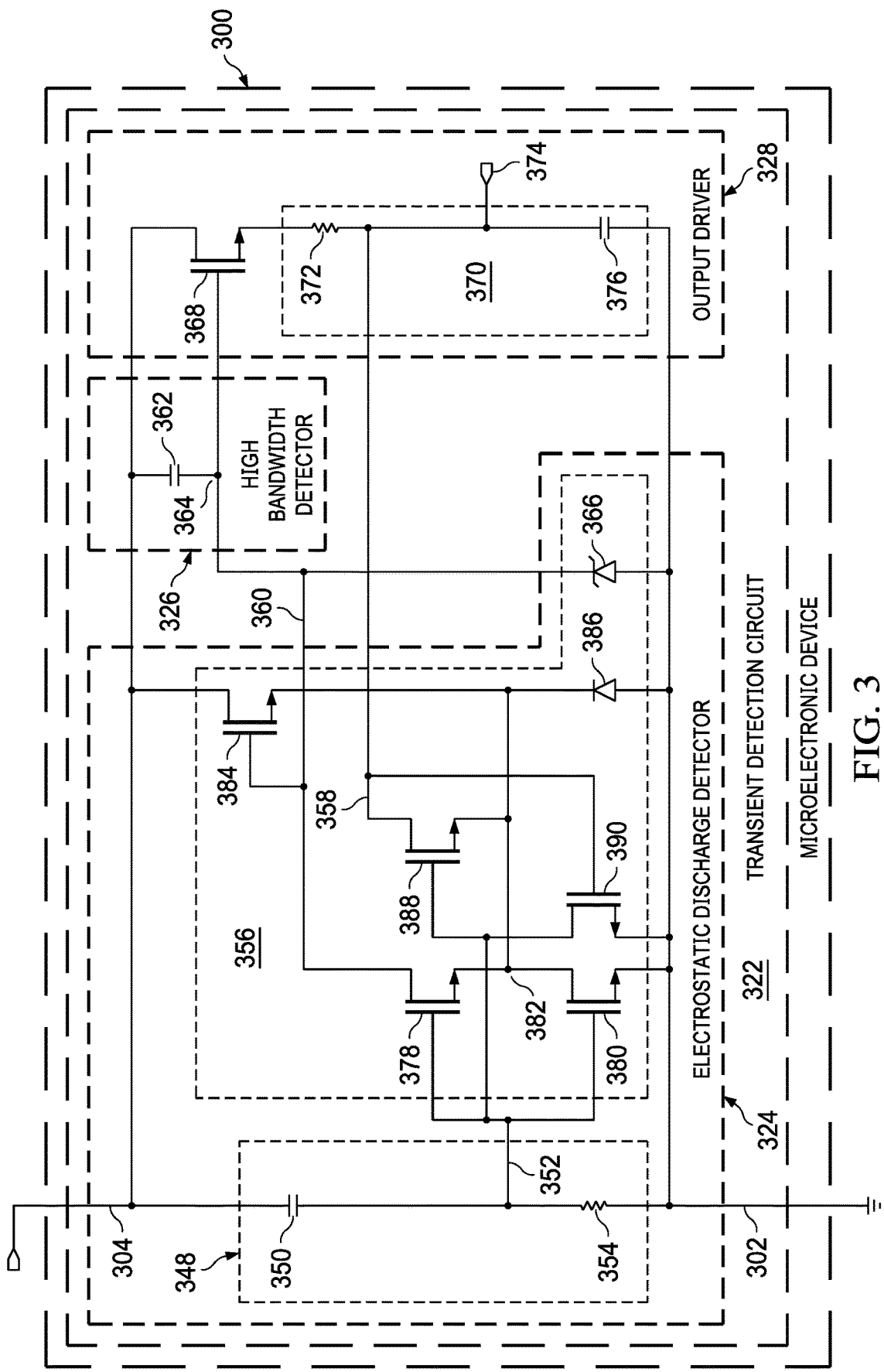
FIG. 3 is a circuit schematic of an example microelectronic device having a transient detection circuit.

FIG. 3 is a circuit schematic of an example microelectronic device 300 having a transient detection circuit 322. The microelectronic device 300 includes a reference line 302 and a protected line 304. The microelectronic device 300 may include a device-specific circuit, not shown in FIG. 3, coupled to the protected line 304 and the reference line 302, which may be sensitive to voltages above a safe operating limit. The microelectronic device 300 may be connected to an external surge protection circuit, not shown in FIG. 3, that is not part of the microelectronic device 300, but is connected to the protected line 304 and the reference line 302. The microelectronic device 300 includes an active FET, and ESD trigger circuit, and a gate control circuit, not shown in FIG. 3, as disclosed in reference to FIG. 1 and FIG. 2, for example. The ESD trigger circuit is configured to turn on the active FET during an ESD event on the protected line 304 to protect the device-specific circuit, as disclosed in reference to FIG. 1. The gate control circuit is configured to turn off the active FET upon receiving a DEACTIVATE signal, and is configured to enable operation of the active FET upon receiving a low state, as disclosed in reference to FIG. 1 and FIG. 2. The microelectronic device further includes a transient detection circuit 322 having an ESD detector 324, a high bandwidth detector 326, and an output driver 328.

The output driver 328 is coupled between the protected line 304 and the reference line 302. The output driver 328 of this example includes an output FET 368 with a drain of the output FET 368 coupled to the protected line 304, and a source of the output FET 368 coupled to the reference line 302 through a low-pass filter 370. The low-pass filter 370 includes an output buffer resistor 372 coupled between the source of the output FET 368 and an output node 374 of the output driver 328, and includes an output buffer capacitor 376 coupled between the output node 374 and the reference line 302. The purpose of the low pass filter 370 is to keep the output node 374 low before ESD detector 324 provides the CLEAR signal to the gate of the output FET 368 and the output node 374 in an ESD event. The output node 374 of the output driver 328 is coupled to the gate control circuit. A gate of the output FET 368 is coupled to the high bandwidth detector 326 and to the ESD detector 324 through the high bandwidth detector 326, and the output node 374 of the output driver 328 is coupled to the ESD detector 324. The output driver 328 is configured to provide the DEACTIVATE signal to the gate control circuit when the output driver 328 receives an ENABLE signal, implemented in this example as a high voltage, from the high bandwidth detector 326 at the gate of the output FET 368 and the ESD detector 324 provides a high impedance state at the gate of the output FET 368 and at the output node 374 of the output driver 328, which does not interfere with the ENABLE signal. The output driver 328 is further configured to provide the low state to the gate control circuit when the output driver 328 receives an ENABLE signal from the high bandwidth detector 326 at the gate of the output FET 368 and the ESD detector 324 provides a CLEAR signal, implemented in this example as a low voltage, to the gate of the output FET 368 and to the output node 374 of the output driver 328, which overrides the ENABLE signal.

The high bandwidth detector 326 of this example includes a blocking capacitor 362 coupled between the protected line 304 and the gate of the output FET 368 of the output driver 328. The high bandwidth detector 326 is configured to provide the ENABLE signal, implemented in this example as a high voltage above a threshold potential of the output FET 368, to the gate of the output FET 368 of the output driver 328, when an overvoltage transient, encompassing both an ESD event and a voltage surge event, occurs on the protected line 304.

The ESD detector 324 of this example includes an input high-pass filter 348 and a voltage discriminator 356. The input high-pass filter 348 is coupled between the protected line 304 and the reference line 302. The input high-pass filter 348 of this example includes an input capacitor 350 coupled between the protected line 304 and an output line 352 of the input high-pass filter 348, and an input resistor 354 coupled between the output line 352 and the reference line 302.

The voltage discriminator 356 of this example includes an upper input FET 378 in series with a lower input FET 380. A drain of the upper input FET 378 is coupled to the blocking capacitor 362 of the high bandwidth detector 326. A source of the lower input FET 380 is coupled to the reference line 302. A source of the upper input FET 378 is coupled to a drain of the lower input FET 380. Gates of the upper input FET 378 and the lower input FET 380 are coupled to the output line 352 of the input high-pass filter 348. The upper input FET 378 and the lower input FET 380 thus provide an input buffer of the voltage discriminator 356, with a buffer output line 382 coupled between the source of the upper input FET 378 and the drain of the lower input FET 380. The output line 352 of the input high-pass filter 348 may be protected by a reverse-biased diode, not shown in FIG. 3, having a breakdown potential that is sufficiently low to prevent damage to the upper input FET 378 and the lower input FET 380 in case of a very high voltage transient on the protected line 304.

The voltage discriminator 356 includes a pull-up transistor 384, implemented as a pull-up FET 384, with a drain coupled to the protected line 304 and a source coupled to the reference line 302 through a high impedance shunt 386, implemented as a reverse-biased diode 386. A gate of the pull-up FET 384 is coupled through a second output line 360 of the voltage discriminator 356 to the blocking capacitor 362 of the high bandwidth detector 326. The pull-up FET 384 is initially turned on when an overvoltage transient occurs on the protected line 304. A source of the pull-up FET 384 is coupled to the buffer output line 382. The voltage discriminator 356 further includes an output FET 388 having a source coupled to the buffer output line 382 and a drain coupled to a first output line 358 of the voltage discriminator 356. A gate of the output FET 388 is coupled to the output line 352 of the input high-pass filter 348, that is, to an input of the input buffer of the voltage discriminator 356, provided by the upper input FET 378 and the lower input FET 380. The voltage discriminator 356 includes a Zener diode 366 coupled between the reference line 302 and the second output line 360. The Zener diode 366 may have a breakdown voltage of 5 volts to 6 volts, by way of example. The breakdown voltage of the Zener diode 366 and a ratio of a width of the pull-up transistor 384 to a width of the lower input FET 380 determine a threshold voltage of the voltage discriminator 356, that is, a minimum voltage on the output line 352 of the input high-pass filter 348 at which the voltage discriminator 356 is triggered to provide the CLEAR signal.

The ESD detector 324 of this example further includes a pull-down transistor 390, implemented as a pull-down FET 390. The pull-down FET 390 has a source coupled to the reference line 302 and a drain coupled to the gate of the output FET 388. A gate of the pull-down FET 390 is coupled to the first output line 358 of the voltage discriminator 356. The first output line 358 of the voltage discriminator 356 of the ESD detector 324 is coupled to the output node 374 of the output driver 328. The second output line 360 of the voltage discriminator 356 of the ESD detector 324 is coupled to the gate of the output FET 368.

The transient detection circuit 322 may operate as disclosed in reference to FIG. 1 and FIG. 2, accruing the advantages disclosed herein. Any of the FETs 368, 378, 380, 384, 388, and 390 of this example may be implemented as high voltage FETs, such as drain-extended FETs.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a protected line;
   a reference line separate from the protected line;
   an active field effect transistor (FET) having a drain coupled to the protected line, a source coupled to the reference line, and a gate;
   an electrostatic discharge (ESD) trigger circuit coupled to the protected line, and to the gate of the active FET, wherein the ESD trigger circuit is configured to turn on the active FET when a first overvoltage transient occurs on the protected line, the first overvoltage transient being characteristic of an ESD event;
   a gate control circuit coupled to the gate of the active FET, the gate control circuit being configured to turn off the active FET when a DEACTIVATE signal is provided to the gate control circuit, and being configured to enable operation of the active FET when a low state is provided to the gate control circuit; and
   a transient detection circuit having an ESD detector, a high bandwidth detector, and an output driver, wherein:
      the ESD detector is coupled to the protected line and to the output driver, the ESD detector being configured to provide a CLEAR signal to the output driver when the first overvoltage transient occurs on the protected line;
      the high bandwidth detector is coupled to the protected line and to the output driver, the high bandwidth detector being configured to provide an ENABLE signal to the output driver when the first overvoltage transient occurs on the protected line or when a second overvoltage transient occurs on the protected line, the second overvoltage transient being characteristic of a voltage surge event; and
      the output driver is configured to provide the low state to the gate control circuit when the ENABLE signal is provided from the high bandwidth detector and the CLEAR signal is provided from the ESD detector.

2. The microelectronic device of claim 1, wherein the term "characteristic of an ESD event" encompasses overvoltage transients prescribed by the Human Body Model, the Charged Device Model, the Machine Model, and the IEC 61000 4 2 Immunity Standard, and excludes overvoltage transients with rise times longer than 500 nanoseconds, and durations of greater than 1 millisecond.

3. The microelectronic device of claim 1, wherein the term "characteristic of a voltage surge" encompasses overvoltage transients with rise times longer than 500 nanoseconds, and durations of greater than 1 millisecond, and excludes overvoltage transients prescribed by the Human Body Model, the Charged Device Model, the Machine Model, and the IEC 61000 4 2 Immunity Standard.

4. The microelectronic device of claim 1, wherein the gate control circuit includes an active FET shunt transistor between the gate of the active FET and the reference line, with a gate of the active FET shunt transistor coupled to the output driver of the transient detection circuit.

5. The microelectronic device of claim 1, wherein the ESD trigger circuit includes an ESD trigger high-pass filter coupled between the protected line and the reference line, the ESD trigger high-pass filter having an output node coupled to the gate of the active FET.

6. The microelectronic device of claim 1, wherein the output driver includes an output FET, a low-pass filter, and an output node, the output FET having a drain coupled to the protected line, a source coupled to the low-pass filter, and a gate coupled to the ESD detector, the low-pass filter being coupled between the source of the output FET and the reference line, the output node being coupled to the gate control circuit.

7. The microelectronic device of claim 6, wherein the low-pass filter includes a resistor coupled between the source of the output FET and the output node of the output driver, and a capacitor coupled between the output node of the output driver and the reference line.

8. The microelectronic device of claim 6, wherein the high bandwidth detector includes a blocking capacitor coupled between the protected line and the gate of the output FET, wherein the blocking capacitor is configured to provide the ENABLE signal to the gate of the output FET when the first overvoltage transient occurs on the protected line.

9. The microelectronic device of claim 6, wherein the ESD detector includes a input high-pass filter and an voltage discriminator, the input high-pass filter being coupled to the voltage discriminator, the input high-pass filter being configured to apply a sufficient potential to the voltage discriminator to activate the voltage discriminator when the first overvoltage transient occurs on the protected line, the voltage discriminator having a first output line coupled to the output node of the output driver and a second output line coupled to the gate of the output FET of the output driver, the voltage discriminator being configured to provide a potential to the output node of the output driver that is close to a potential of the reference line when the first overvoltage transient occurs on the protected line.

10. The microelectronic device of claim 9, wherein the voltage discriminator is configured to provide a high impedance condition to the output node of the output driver when an overvoltage transient that is characteristic of a voltage surge event occurs on the protected line.

11. The microelectronic device of claim 9, wherein the voltage discriminator includes a Zener diode coupled between the second output line of the voltage discriminator and the reference line, wherein a threshold of the voltage discriminator is dependent on a breakdown voltage of the Zener diode.

12. The microelectronic device of claim 1, wherein the protected line includes a power supply interconnect line.

13. The microelectronic device of claim 1, wherein the protected line includes an input/output (I/O) line.

14. A microelectronic device, comprising:
a protected line;
a reference line separate from the protected line;
an active field effect transistor (FET) having a drain coupled to the protected line, a source coupled to the reference line, and a gate;
an electrostatic discharge (ESD) trigger circuit coupled to the gate of the active FET, wherein the ESD trigger circuit includes an ESD trigger high-pass filter coupled between the protected line and the reference line, the ESD trigger high-pass filter having an ESD trigger output line coupled to the gate of the active FET, the ESD trigger high-pass filter being configured to turn on the active FET when a first overvoltage transient occurs on the protected line, the first overvoltage transient being characteristic of an ESD event;
a gate control circuit coupled to the gate of the active FET, the gate control circuit including an active FET shunt transistor having a drain coupled to the gate of the active FET, a source coupled to the reference line, and a gate; and
a transient detection circuit having a high bandwidth detector, an ESD detector, and an output driver, wherein:
the high bandwidth detector includes a blocking capacitor coupled between the protected line and the output driver, wherein the blocking capacitor is configured to provide an ENABLE signal to the output driver when the first overvoltage transient occurs on the protected line;
the ESD detector includes a input high-pass filter and an voltage discriminator, the input high-pass filter being coupled to the voltage discriminator, the input high-pass filter being configured to apply a sufficient potential to the voltage discriminator to activate the voltage discriminator when the first overvoltage transient occurs on the protected line, the voltage discriminator having a first output line coupled to the output driver and a second output line coupled to the output driver, the voltage discriminator being configured to provide a potential to the output driver that is close to a potential of the reference line when triggered by the input high-pass filter; and
the output driver includes an output FET, a low-pass filter, and an output node, the output FET having a drain coupled to the protected line, a source coupled to the low-pass filter, and a gate coupled to the blocking capacitor of the high bandwidth detector and to the second output line of the voltage discriminator, the low-pass filter being coupled between the source of the output FET and the reference line, low pass the low-pass filter being coupled to the output node, the output node being coupled to the gate of the active FET shunt transistor of the gate control circuit and to the first output line of the voltage discriminator, wherein the ENABLE signal is implemented as a voltage sufficient to turn on the output FET of the output driver.

15. The microelectronic device of claim 14, wherein the term "characteristic of an ESD event" encompasses overvoltage transients prescribed by the Human Body Model, the Charged Device Model, the Machine Model, and the IEC 61000 4 2 Immunity Standard, and excludes overvoltage transients with rise times longer than 500 nanoseconds, and durations of greater than 1 millisecond.

16. The microelectronic device of claim 14, wherein the term "characteristic of a voltage surge" encompasses overvoltage transients with rise times longer than 500 nanoseconds, and durations of greater than 1 millisecond, and excludes overvoltage transients prescribed by the Human Body Model, the Charged Device Model, the Machine Model, and the IEC 61000 4 2 Immunity Standard.

17. The microelectronic device of claim 14, wherein the voltage discriminator includes:
an input buffer coupled between the blocking capacitor of the high bandwidth detector and the reference line, wherein an input of the input buffer is coupled to the input high-pass filter, the input buffer having a buffer output line; and an output FET having a source coupled to the buffer output line, a drain coupled to the first output line of the voltage discriminator, and a gate coupled to the input high-pass filter, the output FET of the voltage discriminator being configured to provide a high impedance condition on the first output line of the voltage discriminator when a second overvoltage transient occurs on the protected line, the second overvoltage transient being characteristic of a voltage surge event.

18. The microelectronic device of claim 14, wherein:
the low-pass filter of the output driver includes a resistor coupled between the source of the output FET and the output node of the output driver, and a capacitor coupled between the output node of the output driver and the reference line.

19. The microelectronic device of claim 14, wherein:
the ESD trigger circuit includes a gate driver FET with a drain coupled to the protected line, a source coupled to the gate of the active FET, and a gate coupled to the ESD trigger output line of the ESD trigger high-pass filter; and the gate control circuit includes a gate driver FET shunt transistor coupled between the gate of the gate driver FET and the reference line, the gate driver FET shunt transistor having a gate coupled to the output node of the output driver.

20. The microelectronic device of claim 14, wherein the gate control circuit includes an operational shunt transistor coupled between the gate of the active FET and the reference line, the operational shunt transistor having a gate; and further comprising a primary disable circuit coupled to the gate of the operational shunt transistor, the primary disable circuit being configured to turn off the active FET during operation of the microelectronic device.

21. The microelectronic device of claim 14, wherein the protected line includes a power supply interconnect line.

22. The microelectronic device of claim 14, wherein the protected line includes an input/output (I/O) line.

23. A microelectronic device, comprising:
a protected line;
a reference line separate from the protected line;
an active field effect transistor (FET) having a drain coupled to the protected line, a source coupled to the reference line, and a gate;
an electrostatic discharge (ESD) trigger circuit coupled to the gate of the active FET, wherein the ESD trigger circuit includes an ESD trigger high-pass filter coupled between the protected line and the reference line, the ESD trigger high-pass filter having a time constant of 5 nanoseconds to 20 nanoseconds, the ESD trigger high-pass filter having an ESD trigger output line coupled to the gate of the active FET;
a shunt transistor between the gate of the active FET and the reference line, the shunt transistor having a gate; and
a transient detection circuit having a high bandwidth detector, an ESD detector, and an output driver, wherein:
the high bandwidth detector includes a blocking capacitor coupled between the protected line and the output driver, wherein the blocking capacitor is configured to provide an ENABLE signal to the output driver when a first overvoltage transient occurs on the protected line, the first overvoltage transient being characteristic of an ESD event;
the ESD detector includes:
an input high-pass filter and a voltage discriminator, the input high-pass filter being coupled between the protected line and the reference line, the input high-pass filter having a time constant of 5 nanoseconds to 20 nanoseconds;
a voltage discriminator, including:
an upper input FET in series with a lower input FET, wherein a drain of the upper input FET is coupled to the blocking capacitor of the high bandwidth detector, a source of the lower input FET is coupled to the reference line, a source of the upper input FET is coupled to a drain of the lower input FET, and gates of the upper input FET and the lower input FET are coupled to an output line of the input high-pass filter;
a first output line coupled to the output driver and a second output line coupled to the output driver; and
an output FET having a source coupled to the source of the upper input FET and the drain of the lower input FET, a drain coupled to the output line of the voltage discriminator, and a gate coupled to the input high-pass filter; and
the output driver includes an output FET, a low-pass filter with an output node, the output FET having a drain coupled to the protected line, a source coupled to the low-pass filter, and a gate coupled to the protected line through the blocking capacitor, and to the second output line of the voltage discriminator, the low-pass filter being coupled between the source of the output FET and the reference line, the output node being coupled to a gate of an active FET shunt transistor of a gate control circuit and to the first output line of the voltage discriminator.

24. The microelectronic device of claim 23, wherein the voltage discriminator further includes:
a pull up transistor, including a drain coupled to the protected line, a source coupled to the reference line through a high impedance shunt and to the source of the upper input FET and the drain of the lower input FET, and a gate coupled to the blocking capacitor of the high bandwidth detector;
a pull down transistor, including a source coupled to the reference line, a drain coupled to the gate of the output FET and to the output line of the input high-pass filter, and a gate coupled to the first output line of the voltage discriminator; and
a Zener diode coupled between the second output line of the voltage discriminator and the reference line, wherein a threshold of the voltage discriminator is dependent on a breakdown voltage of the Zener diode.

25. The microelectronic device of claim 23, wherein the protected line includes a power supply interconnect line.

26. The microelectronic device of claim 23, wherein the protected line includes an input/output (I/O) line.

27. A device, comprising:
a protected node and a reference node;
a switch connected between the protected node and the reference node; and
a control circuit configured to:
control the switch based on a first time constant to connect the protected node to the reference node responsive to an electrostatic discharge (ESD) event on the protected node; and control the switch to a high impedance state based on a different second time constant responsive to a voltage surge on the protected node.

28. A method, comprising:

connecting a switch between a protected node and a reference node;

configuring the switch to connect the protected node to the reference node based in a first time constant responsive to an electrostatic discharge (ESD) event on the protected node; and configuring the switch to enter a high impedance state based on a different second time constant responsive to a voltage surge on the protected node.

* * * * *